United States Patent [19]
Jedwab et al.

[11] Patent Number: 5,410,309
[45] Date of Patent: Apr. 25, 1995

[54] METHOD AND SYSTEM FOR COMMUNICATING DATA

[75] Inventors: Jonathan Jedwab, Clifton; Simon E. Crouch, Stanton St. Quintin, both of England

[73] Assignee: Hewlett-Packard Company, Palo Alto, Calif.

[21] Appl. No.: 148,717

[22] Filed: Nov. 8, 1993

[30] Foreign Application Priority Data

| Nov. 6, 1992 [EP] | European Pat. Off. ........... 92310199 |
| Jan. 14, 1993 [EP] | European Pat. Off. ........... 93300238 |
| Jun. 15, 1993 [EP] | European Pat. Off. ........... 93304662 |

[51] Int. Cl.⁶ .............................................. H03M 7/00
[52] U.S. Cl. ..................................... 341/95; 375/260; 371/39.1
[58] Field of Search ............... 341/58, 94, 95, 106; 375/10, 38; 371/2, 2.1, 38.1, 39.1

[56] References Cited

U.S. PATENT DOCUMENTS

| 4,188,616 | 2/1980 | Kazami et al. ............. 340/146.1 AL |
| 4,383,316 | 5/1983 | Seidel ................................. 370/118 |
| 4,564,941 | 1/1986 | Woolley et al. ........................ 371/2 |
| 4,706,250 | 11/1987 | Patel ................................... 371/39 |
| 5,119,402 | 6/1992 | Ginzburg et al. ..................... 375/17 |
| 5,251,215 | 10/1993 | Dravida et al. ..................... 370/94.1 |
| 5,293,165 | 3/1994 | Iwaki et al. ......................... 341/102 |

FOREIGN PATENT DOCUMENTS

| 2469046 | 5/1981 | France . |
| 1540617 | 2/1979 | United Kingdom . |
| 2191662 | 12/1987 | United Kingdom . |
| 1250908 | 10/1991 | United Kingdom . |

*Primary Examiner*—Marc S. Hoff
*Attorney, Agent, or Firm*—Douglas L. Weller

[57] ABSTRACT

A data stream to be communicated over a plurality of channels is divided into blocks (A1,B1,C1,D1,A2,B2, . . . ), and each successive block is transmitted along a different channel (A,B,C,D) on a cyclic basis. To reduce or eliminate the possibility of undetectable errors occurring owing to noise affecting all channels simultaneously and thereby corrupting data in several successive blocks propagating in parallel through the channels, the blocks in at least one channel (A,B) are offset in time relative to the blocks in another channel (C,D). In the case of four channels, such as four-conductor cable, the blocks on two channels are offset by half the length of a block relative to the blocks on the remaining two channels.

31 Claims, 5 Drawing Sheets

| 5-bit data word | 6-bit code | |
|---|---|---|
| 00000 | 111001 | 000110 |
| 00001 | 001110 | |
| 00010 | 110010 | |
| 00011 | 000111 | |
| 00100 | 100110 | |
| 00101 | 010011 | |
| 00110 | 011110 | 100001 |
| 00111 | 100111 | 011000 |
| 01000 | 110100 | |
| 01001 | 010110 | |
| 01010 | 111010 | 000101 |
| 01011 | 100011 | |
| 01100 | 110001 | |
| 01101 | 110110 | 001001 |
| 01110 | 011010 | |
| 01111 | 010101 | |
| 10000 | 101011 | 010100 |
| 10001 | 011011 | 100100 |
| 10010 | 100101 | |
| 10011 | 101010 | |
| 10100 | 001011 | |
| 10101 | 101001 | |
| 10110 | 010111 | 101000 |
| 10111 | 110101 | 001010 |
| 11000 | 011001 | |
| 11001 | 101100 | |
| 11010 | 101101 | 010010 |
| 11011 | 011100 | |
| 11100 | 101110 | 100010 |
| 11101 | 110011 | 001100 |
| 11110 | 001101 | |
| 11111 | 111000 | |

| 5-bit data word | 6-bit code | | |
|---|---|---|---|
| 00000 | 001100 | | 110011 |
| 00001 | | 101100 | |
| 00010 | 100010 | | 101110 |
| 00011 | | 001101 | |
| 00100 | 001010 | | 110101 |
| 00101 | | 010101 | |
| 00110 | | 001110 | |
| 00111 | | 001011 | |
| | | | |
| 01000 | | 000111 | |
| 01001 | | 100011 | |
| 01010 | | 100110 | |
| 01011 | 000110 | | 111001 |
| 01100 | 101000 | | 010111 |
| 01101 | | 011010 | |
| 01110 | 100100 | | 011011 |
| 01111 | | 101001 | |
| | | | |
| 10000 | 000101 | | 111010 |
| 10001 | | 100101 | |
| 10010 | 001001 | | 110110 |
| 10011 | | 010110 | |
| 10100 | | 111000 | |
| 10101 | 011000 | | 100111 |
| 10110 | | 011001 | |
| 10111 | 100001 | | 011110 |
| | | | |
| 11000 | | 110001 | |
| 11001 | | 101010 | |
| 11010 | 010100 | | 101011 |
| 11011 | | 110100 | |
| 11100 | | 011100 | |
| 11101 | | 010011 | |
| 11110 | 010010 | | 101101 |
| 11111 | | 110010 | |

METHOD AND SYSTEM FOR COMMUNICATING DATA

TECHNICAL FIELD

This invention relates to methods and systems for communicating data, and in particular to methods and systems for communicating data over a plurality of channels, such as a cable having a plurality of conductors (for example a four-wire telephone cable), and for encoding and/or decoding data, for example in connection with such communication.

BACKGROUND ART

The spread of personal computers and workstations has led to the development of networks for interconnecting such equipment and common resources such as printers and data storage devices. More powerful and sophisticated computing equipment and programs have progressively become available, allowing the processing of data in larger and larger quantities, for example in the form of database information and graphic images. These developments have in turn placed increasing demands on the speed and capacity of networks.

Various new networking technologies have been proposed to cater for these demands. One such technology is the fibre distributed data interface (FDDI), which is based on the use of optical fibres and optical signals. However, practical experience has shown that although this technology can provide the required performance, it is relatively expensive, requiring the costly process of installing complete new networks of optical fibre, which is itself inherently expensive.

Accordingly attention has also been directed to the possibility of transferring data at high speed over existing wiring installations, thereby avoiding the cost of installing a new network and gaining additional return for the expense previously incurred in installing the existing wiring.

One possible technique along these lines involves the use of unshielded twisted-pair (UTP) telephone cables of the kind already used for lower-speed local-area networks. In this technique, described for example in U.S. Pat. No. 5,119,402, the required high data rate is achieved by transferring the data over multiple conductors, so that different portions of the data are transmitted simultaneously over respective conductors.

Although this technique provides many advantages, it also suffers from potential specific problems. In particular, a primary source of noise affecting such transmissions is electrical impulses, which can affect all conductors together for an extended period relative to the duration of transmission of a data bit. Thus, for example, twenty successive bits of the data to be transmitted may be split into four blocks of five bits each, and the four blocks transmitted in encoded form as a group simultaneously along respective ones of four conductors in a multi-conductor cable. It is possible for two successive groups of four blocks each to be affected by electrical noise. Since one group of blocks represents twenty bits, a total of forty bits may be corrupted. Although the data may be protected against some corruption by the use, for example, of a cyclic redundancy check (CRC) code, such codes are typically based on polynomials of degree thirty-two at most to limit the associated processing burden. Such a CRC code can be guaranteed to detect the corruption of at most thirty-two consecutive bits in the data stream, so corruption of forty successive bits can lead to errors which the CRC code does not detect.

It is an object of this invention to provide a method and system for communicating data, for example using cables with multiple conductors, which at least alleviate this problem.

DISCLOSURE OF INVENTION

According to one aspect of this invention there is provided a method for communicating data over a plurality of channels, comprising the steps of: generating a plurality of data signals, each said signal comprising successive blocks of data; and simultaneously transferring said data signals over respective channels, commencement of said blocks on at least one of said channels being temporally offset relative to commencement of said blocks on another of said channels.

We have found that by offsetting data blocks on at least one channel in this way, the incidence of undetectable errors can be reduced or eliminated.

Preferably a data block on said one channel starts substantially when the mid-point of a data block occurs on said other channel; the blocks may have the same size and repetition rate, both within each channel and as between channels.

Where there are four channels (e.g. the conductors of a four-conductor cable), data blocks on first and second channels may be coincident with each other, and data blocks on third and fourth channels may be coincident with each other and offset relative to data blocks on said first and second channels.

According to another aspect of this invention there is provided a system for communicating data over a plurality of channels, wherein respective data signals are transferred over respective channels simultaneously, each said signal comprising successive blocks of data, and wherein commencement of said blocks on at least one of said channels is temporally offset relative to commencement of said blocks on another of said channels.

Figure 3:
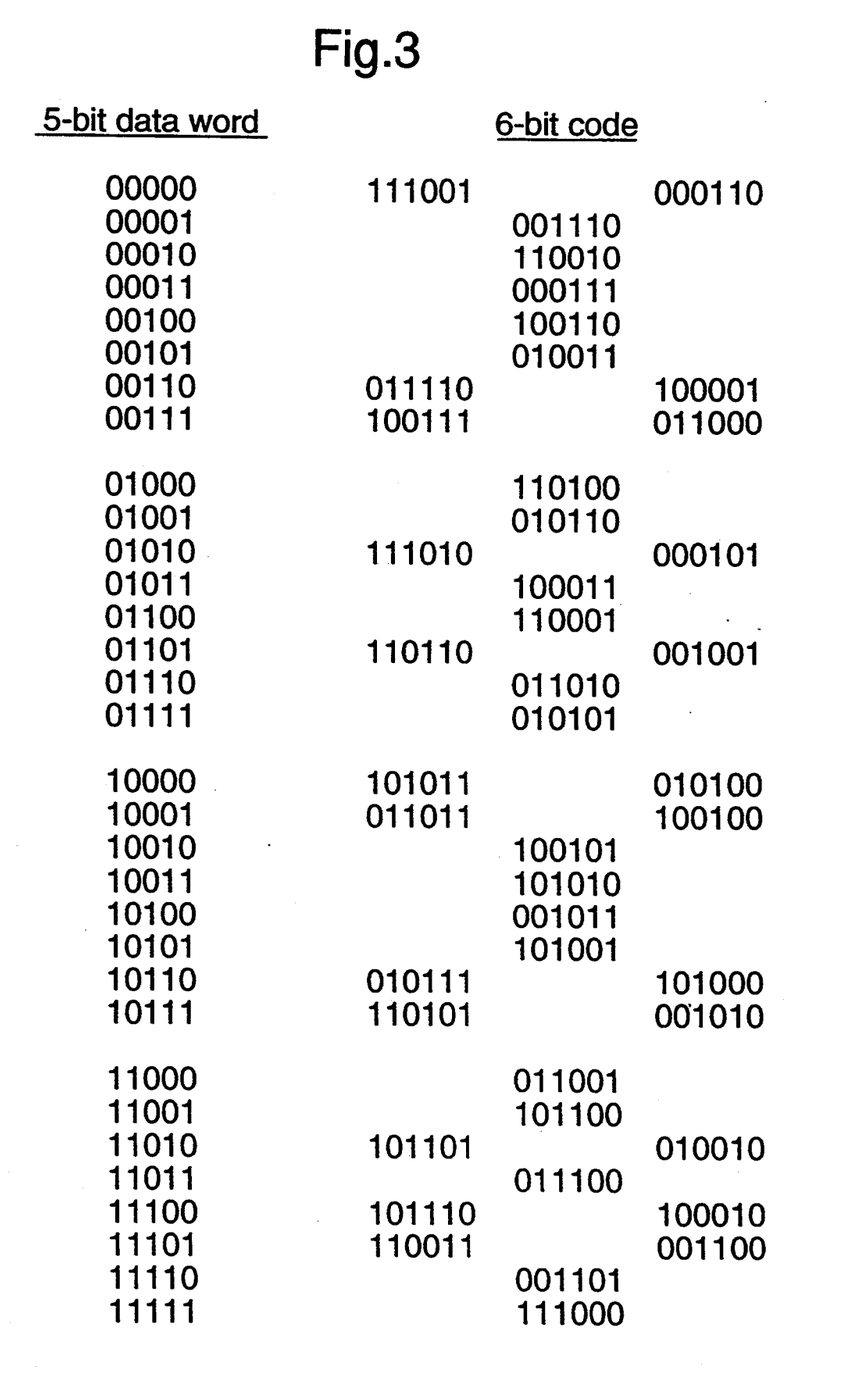
FIG. 3 is a table of five-bit data values and corresponding six-bit code values.
Figure 8:
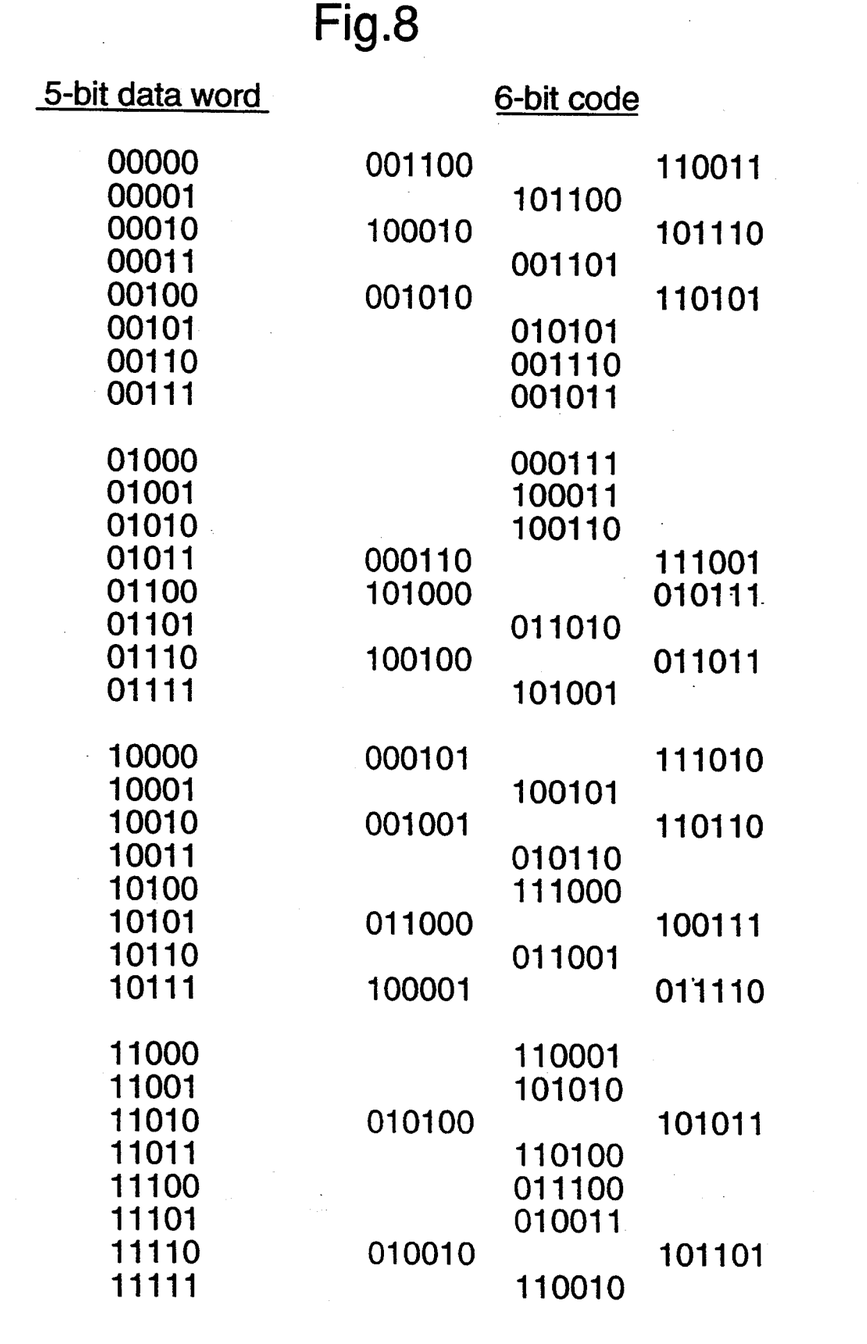
FIG. 8 is an alternative table of five-bit data values and corresponding six-bit code values.

According to a further aspect of this invention there is provided a method of encoding 5-bit data words as 6-bit code words for use with a cyclic redundancy check algorithm based upon the polynomial $$g(x)=x^{32}+x^{26}+x^{23}+x^{22}+x^{16}+x^{12}+x^{11}+x^{10}+x^{8}+x^{7}+x^{5}+x^{4}+x^{2}+x+1$$

wherein 6-bit code words are selected in accordance with the values of the 5-bit data words and a preselected one of the tables shown in FIGS. 3 and 8, or an invariance transformation thereof, code word selection in the case of dam words having two possible code words being of the code word from a column of the table alternate to the column from which a code word was selected upon a preceding occurrence of any of such data words. In a complementary method of decoding 5-bit data words from 6-bit code words, 5-bit data words are selected in accordance with the values of the 6-bit code words and a preselected one of the tables shown in FIGS. 3 and 8, or an invariance transformation thereof.

BRIEF DESCRIPTION OF DRAWINGS

A method and system in accordance with this invention for communicating data using four-conductor unshielded twisted-pair cable will now be described, by way of example, with reference to the accompanying drawings, in which.

BEST MODE FOR CARRYING OUT THE INVENTION, & INDUSTRIAL APPLICABILITY

The present invention is intended for use in circumstances where a stream of data is communicated over a plurality of channels, successive portions of the data stream being communicated simultaneously over different respective channels in order to obtain a higher bandwidth than would be possible if all the data were transmitted over a single such channel. For convenience the invention will be described in the context of transmission of binary data over a cable having four channels or conductors (e.g. four pairs of twisted wires). However, the invention is not limited to this particular number of channels nor to this type of channel nor to binary data. In practice the cable would, for example, form part of a network connecting many stations or nodes, such as personal computers, workstations, multi-user computers, printers or data storage units. Circuit devices associated with these stations would provide the necessary functions for assembling data and network operating information into frames or packets for transmission, for controlling access to the network and for transmitting and receiving physical signals on the cable (for example by differential signalling in the case of twisted-pair conductors). The present invention is independent of the particular details of these functions and may for example be implemented in conjunction with existing network technologies; since such technologies already incorporate known techniques for providing these functions, and the functions form no part of the present invention, they will not be described here.

Figure 1:
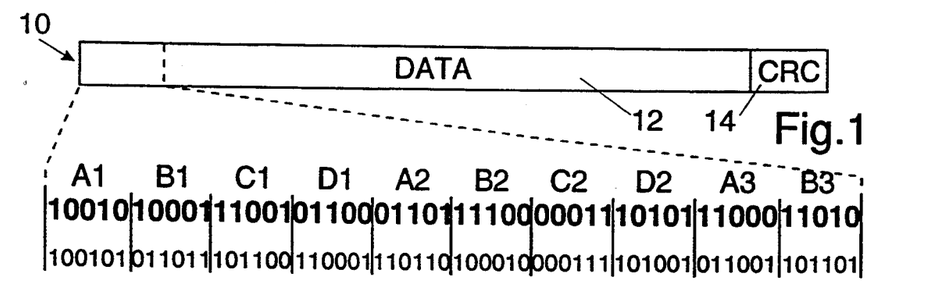
FIG. 1 shows the manner in which data is formatted for communication over the cable.
Figure 2:
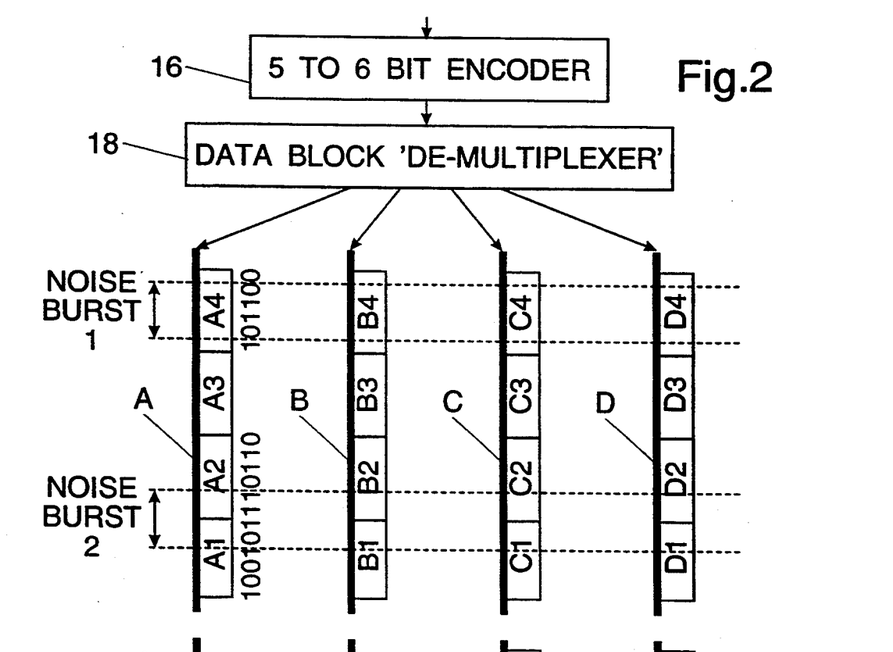
FIG. 2 illustrates the effect of noise on data communicated over the cable.

Referring to FIGS. 1 and 2, a data frame intended to be communicated over a four-conductor cable is shown schematically at 10. This frame comprises: a binary digital message 12 to be transferred, starting with the leftmost bit as shown in FIG. 1, between stations on the network; and an associated thirty-two bit CRC block 14 containing check data derived from the message 12 in known manner in accordance with a predetermined cyclic redundancy check (CRC) algorithm. In the present example it is assumed that the CRC value is derived from the message using a polynomial of degree thirty-two, such as $$g(x) = x^{32} + x^{26} + x^{23} + x^{22} + x^{16} + x^{12} + x^{11} + x^{10} + x^8 + x^7 + x^5 + x^4 + x^2 + x + 1.$$

For transmission over the four-conductor cable the data frame 10 is split into consecutive blocks of five bits each, and the blocks are distributed among the four conductors (herein labelled A to D) on a cyclic basis and starting with the block containing the leftmost bit of the data frame. Thus this first block, labelled A1 in FIG. 1, is transmitted via conductor A, the next block (B1) via conductor B, the third block (C1) via conductor C and the fourth (D1) via conductor D. The cycle then repeats, with conductor A being used again, for the fifth block (A2), and so on.

Prior to transmission the five-bit data blocks are encoded by a 5-to-6 bit encoder 16 (FIG. 2) into six-bit values according to a substitution table, to provide a measure of inherent error detection. The encoding substitutions may be as shown in FIG. 3. These particular substitutions are selected in part to maintain d.c. balance on each conductor, by ensuring that after transmission of each coded data block the accumulated totals of binary ones and zeroes differ by no more than two. Thus, in the example shown in FIG. 3, twenty substitutions are assigned unique codes comprising respective ones of the twenty six-bit values which contain three binary zeroes and three binary ones. The remaining twelve data blocks are each assigned two possible six-bit code values, one containing two binary zeroes and the other containing four. The encoding is implemented so that on the first occasion one of these twelve data blocks occurs for transmission along a particular conductor, the corresponding two-zero encoding (for example) is selected; on the next occasion that any of these twelve data blocks occurs for transmission along that same conductor, the corresponding four-zero encoding is used; thereafter the use of the two-zero and four-zero encodings continues to alternate for each occurrence of any of these twelve data blocks in respect of that conductor. Thus for each conductor the numbers of two-zero and four-zero six-bit codes will differ at most by one, maintaining an average of three binary zeroes per six-bit code and providing the desired d.c. balance. In FIG. 1 illustrative five-bit data blocks are indicated in bold characters, and corresponding six-bit code values are indicated below them in normal weight characters.

The particular set of substitutions given in FIG. 3 is illustrative only; different arrangements of five-bit data values and six-bit code values may be assigned as desired, as described below with reference to FIG. 8.

After encoding, the six-bit code values are distributed or 'de-multiplexed' by a de-multiplexer 18 among the four conductors A to D on a cyclic basis as described above. Thus, as shown in FIG. 2, conductor A will carry encoded data blocks A1, A2, A3, etc. in succession (leftmost bit of each first), conductor B will carry encoded data blocks B1, B2, B3, etc., and likewise for conductors C and D.

FIG. 2 also illustrates the potential effects of bursts of electrical noise on the data carried by the conductors A to D. Typically such a noise burst can interfere with the data for a period as long as the interval occupied by four of the six bits of an encoded data block, as indicated by the dashed lines. Thus, if a noise burst happens to commence at or just after the start of a data block, as illustrated by the noise burst 1 in FIG. 2, the encoded data block on each of the four conductors may be corrupted. As a result of the encoding process, such corruption can completely alter the value obtained upon decoding, even though only some of the bits of the encoded data block are affected. The corrupted encoded data blocks correspond to four successive five-bit data values of the original data frame. Thus up to twenty successive bits of the data frame may be corrupted. Since the CRC algorithm is based on a polynomial of degree thirty-two, errors involving twenty successive bits are always detected.

However, it is also possible for noise to affect two successive data blocks on each conductor, as illustrated by the noise burst 2 in FIG. 2. This noise burst straddles the end of one data block and the start of the next data block on each conductor. Thus, the final two bits of encoded data block A1 (01) and the first two bits of data block A2 (11) may be corrupted. Consequently a total of eight successive data blocks (forty successive bits) of the original data frame may be corrupted. A CRC algorithm based on a polynomial of degree thirty-two cannot be guaranteed to detect errors affecting this many data bits, so there is a possibility of undetected errors occurring. Although a longer CRC polynomial could be used, this would impose an additional and undesirable processing burden on the equipment included in the network.

Figure 4:
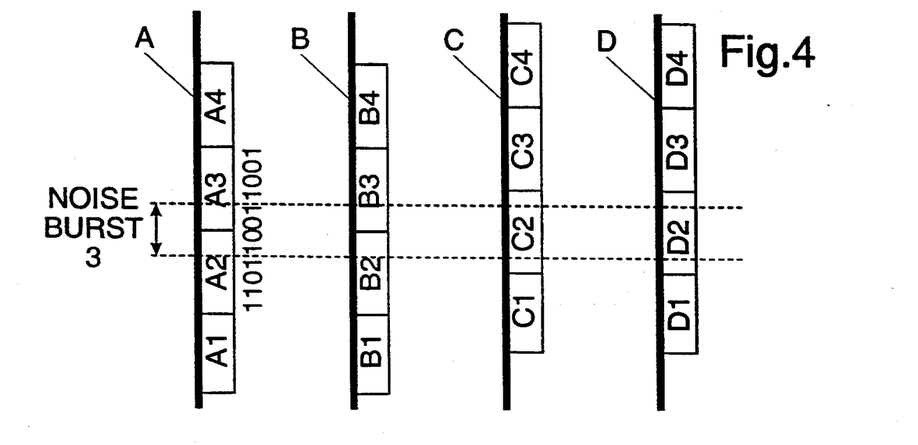
FIG. 4 illustrates reduction possible with the present invention in the effect of noise on data communicated over the cable.

FIG. 4 illustrates a solution to this problem in accordance with this invention. In contrast to FIG. 2, the encoded data blocks in FIG. 4 are transmitted on different ones of the four conductors temporally offset from one another. In the specific example shown in FIG. 4, data blocks are transmitted on conductors A and B coincidentally (or, in terms of overall blocks, in phase with each other), and offset from (or out of phase with) the data blocks transmitted coincidentally with one another on conductors C and D. The offset in this case is equal to half the length of the encoded data blocks. Thus encoded data blocks on conductors C and D commence half-way through the transmission of encoded data blocks on conductors A and B.

With this arrangement it is still possible for a burst of noise arbitrarily corrupting four successive code bits on all four conductors simultaneously to straddle two encoded data blocks on each of two of the conductors (see the noise burst 3 in FIG. 4). However, by virtue of the offset timing of the data blocks on the other two conductors, this noise burst can only affect one data block at most on each of the other two conductors. If the noise burst 3 were to occur two code bits later, as it would have to do to affect encoded blocks C3 and D3 at all, it would no longer affect blocks A2 and B2; although two blocks would now be affected on conductors C and D, only one block would be affected on each of A and B. As a result, the maximum number of consecutive data blocks which can be corrupted is reduced to six, corresponding to thirty successive bits of the original data frame. Corruption even of this many data bits can be reliably detected by a CRC algorithm using a degree thirty-two polynomial.

The required offset in the transmission times of data blocks on the different conductors may be provided in various ways. One possible approach involves the use of shift registers as shown in FIGS. 5 and 6.

Figure 5:
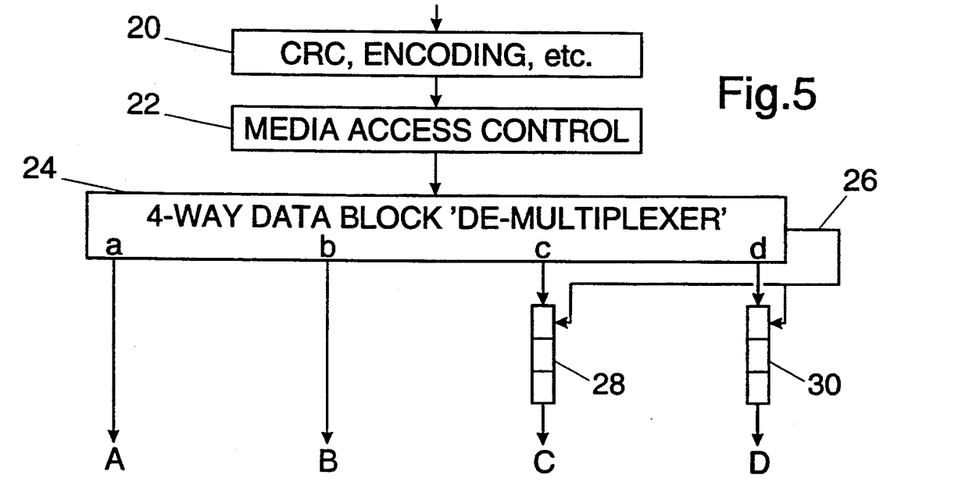
FIG. 5 is a block schematic diagram of part of a transmitter incorporating the present invention.

Referring to FIG. 5, data for transmission is supplied to a circuit 20 which performs the steps of calculating the CRC value and appending it to the message data, and encoding successive blocks of five data bits to derive six-bit encoded blocks as described above. The encoded data blocks are supplied to a media access control (MAC) circuit 22 which coordinates access to the network cable in accordance with a predetermined protocol to ensure efficient use of the communication bandwidth provided by the cable. The MAC circuit 22 passes the encoded blocks to a four-way 'de-multiplexer' 24, which distributes the blocks cyclically among four outputs a to d, and generates a clock signal on a line 26 which is synchronized with the digital signals appearing on these outputs. The circuit 24 is described herein as a de-multiplexer even though its input signal is not a multiplex signal in the conventional sense, since its function is essentially that of de-multiplexing: cyclically routing successive portions of the incoming signal to respective ones of its outputs according to a predetermined pattern.

The outputs a and b of the de-multiplexer 24 are coupled directly to the conductors A and B; however, the outputs c and d are coupled to the inputs of respective three-bit shift registers 28 and 30. These shift registers each receive the clock signal on the line 26, and their outputs are coupled to the conductors C and D. Thus the signals on the outputs c and d of the de-multiplexer 24 are actually propagated over the conductors C and D with a time delay of three bit periods (half the duration of a complete encoded data block) relative to the signals on the conductors A and B.

Figure 6:
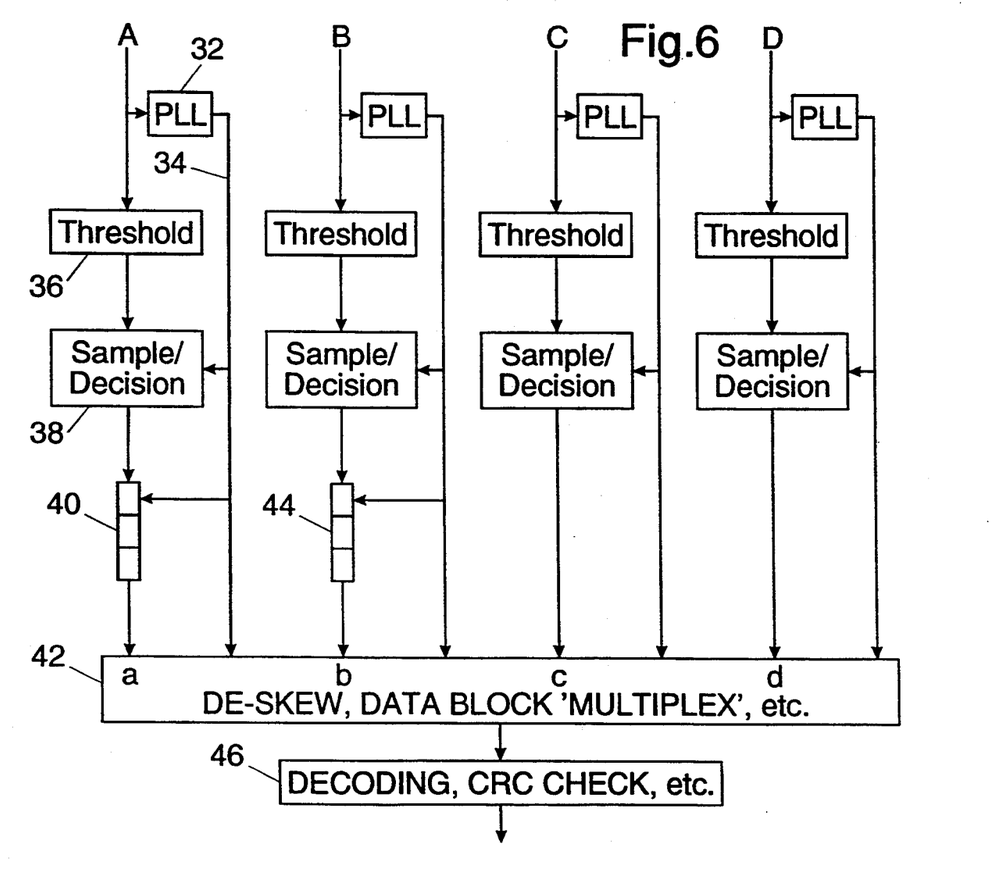
FIG. 6 is a block schematic diagram of part of a receiver incorporating the present invention.

Referring to FIG. 6, a pulse signal on the conductor A is coupled to the input of a phase-locked loop (PLL) 32, which generates a clock signal on a line 34 in synchronism with the incoming pulse signal. This signal is also supplied to the input of a threshold circuit 36 which restores voltage levels occurring in the pulse signal to the correct values indicative of binary zero and one, by comparison with predetermined threshold magnitudes. The restored pulse signal is coupled to the input of a sample and decision circuit 38 which samples the signal in synchronism with the clock signal on the line 34 and generates an output digital signal phase-locked to the clock signal and having a binary value dependent on the value of the sample.

The output of the sample and decision circuit 38 is connected to the input of a three-bit shift register 40 which also receives the clock signal on the line 34 and has its output coupled to an input a of a de-skew and multiplexing circuit 42 which also receives the associated clock signal. The pulse signal on the conductor B is treated in a similar manner to produce an output digital signal which is coupled via a three-bit shift register 44 to an input b of the circuit 42. This signal is phase-locked to a respective clock signal which is also supplied to the circuit 42.

Similar processing is applied to the pulse signals on the conductors C and D by respective circuitry associated with those conductors to produce associated output digital signals and clock signals. However, these two output digital signals are coupled directly from the associated sample and decision circuits to inputs c and d of the de-skew and multiplexing circuit 42, without traversing any intervening shift register.

The de-skew and multiplexing circuit 42 applies minor timing corrections to the four output digital signals, to compensate for any minor timing skew which may have arisen between them during propagation along the four-conductor cable, and then 'multiplexes' the four signals by coupling blocks of six bits from each input in turn to its output to reconstruct the original encoded data stream.

This encoded data stream is fed to a circuit 46 which decodes each six-bit encoded block to derive the corresponding five-bit data block. If any six-bit encoded value is encountered which is invalid or which has an incorrect number of binary zero bits the entire data frame is rejected. Otherwise tile circuit 46 assembles the complete data frame and recalculates the CRC value for comparison with the transmitted CRC value.

The inclusion of the shift registers 40 and 44 at the reception end of the signal path for the signals on the conductors A and B introduces a three-bit delay which matches that provided by the shift registers 28 and 30 in FIG. 5, so that the signals on all four conductors experience the same total delay from this source. However, during actual propagation along the conductors the data blocks on conductors C and D are offset relative to those on conductors A and B, with the consequent advantages described above.

It should be noted that the communication of five-bit data blocks and six-bit encoded blocks over four channels comprising wire conductors in a cable as described above is purely illustrative; other lengths of data block and numbers and types of channels may be used. Likewise the three-bit offset between data blocks on different conductors is an optimum value related to the particular block length chosen for the purposes of description. The actual offset in any particular case may differ from this amount, and need not be half the block length.

The arrangement described above ensures that all errors caused by four code bit noise pulses will affect no more than thirty consecutive data bits (in the particular example given), and thus will be detectable with a thirty-two bit CRC algorithm. However, it is possible, by appropriate choice of the correspondence between (five-bit) data values and (six-bit) code values, to avoid the occurrence of errors which affect larger numbers of consecutive data bits and which would not generally be detectable without resorting to a CRC algorithm based on a higher degree polynomial.

Thus, for example, to avoid undetectable errors caused by noise bursts more than four code bits in duration and affecting up to forty consecutive data bits, with a CRC polynomial of degree thirty-two, a list may be prepared of all possible forty-bit errors which are not detectable by the CRC algorithm. In this context 'error' means the result of an exclusive-OR operation between transmitted data and corrupted received data. For any particular CRC polynomial of degree thirty-two there are two hundred and fifty-five such error values.

An analysis may then be performed of possible forty-bit errors which can arise from noise affecting data being communicated, for different choices of five-bit to six-bit encodings (it will be apparent to those skilled in the art that there is an extremely large population of such encodings). Typically it will be found that only some of the listed undetectable errors will arise for any particular choice of encoding. However, for at least some CRC polynomials there exist certain encodings which, however corrupted by a noise burst up to six code bits in duration (and involving up to a maximum of forty consecutive data bits), do not give rise to any of these two hundred and fifty-five undetectable errors for any data value. Identification and use of such an encoding in conjunction with the offsetting of data blocks on different channels as described above will ensure that all errors arising from noise bursts up to six code bits in duration will be reliably detected. The encoding given in FIG. 3 is an example of an encoding having this property.

FIG. 8 is an example of another encoding having similar properties, but which, used in conjunction with the offsetting of dam blocks on different channels, will ensure that all errors arising from noise bursts up to seven code bits in duration (and thus arbitrarily corrupting seven successive code bits on all four conductors simultaneously) will be reliably detected. Errors arising from a combination of noise and signal skew as between the different conductors A to D, and together having a duration of up to seven code bits, will likewise be reliably detected.

Figure 7:
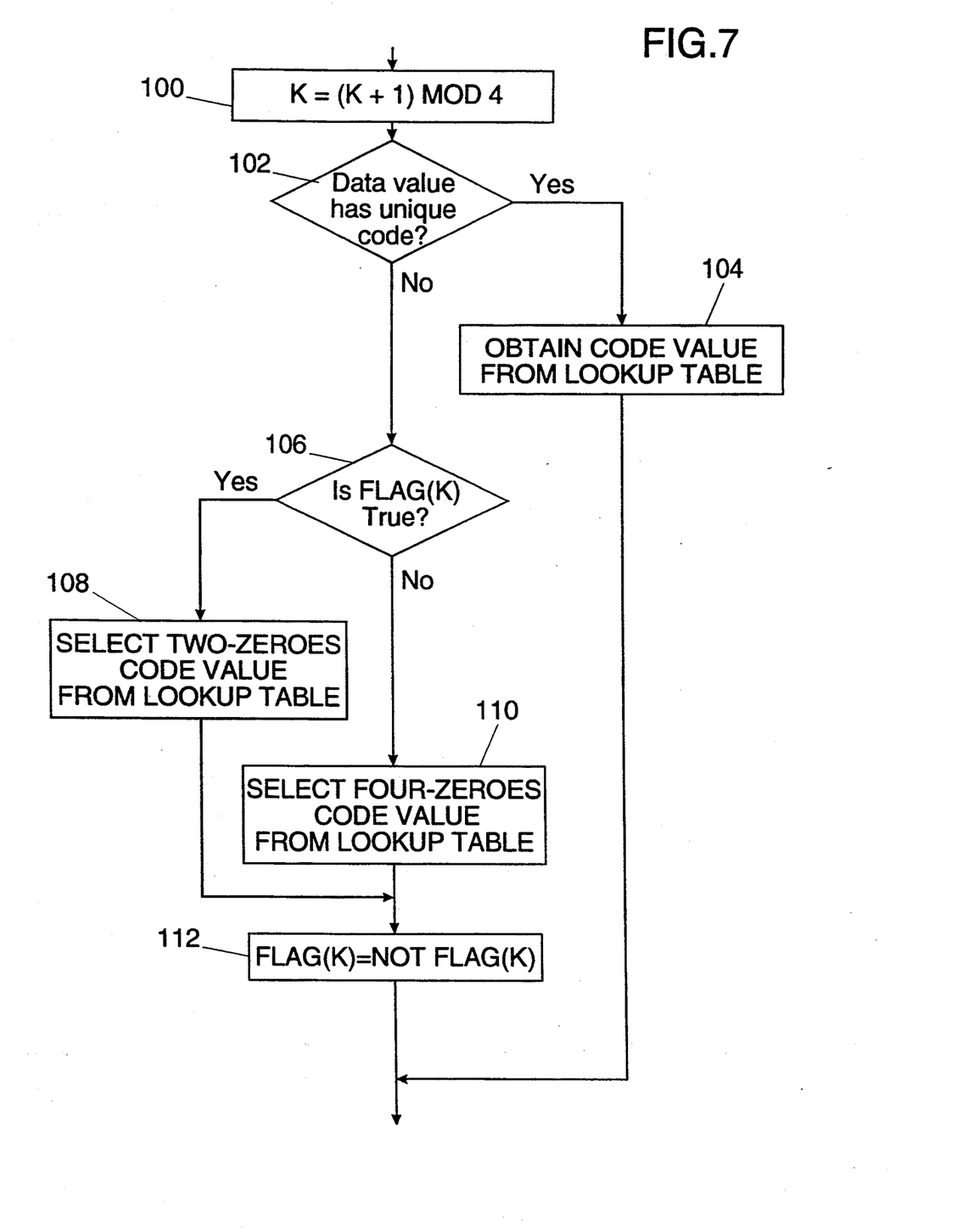
FIG. 7 is a flow diagram of a method for encoding data blocks according to the table in FIG. 3.

FIG. 7 shows a flow diagram of a method for implementing such an encoding. Referring to FIG. 7, at step 100 a counter K is incremented according to the relationship $$K=(K+1) \text{modulo } 4$$

so that the counter cyclically takes on the values zero to three inclusive. The purpose of this counter is to keep track of which conductor the current (encoded) data value will be transmitted along. At step 102 the data value to be encoded is tested to check whether it has one or two corresponding six-bit code values. If there is a unique corresponding code value, the procedure obtains that value from a look-up table at step 104 and exits. Otherwise the procedure advances to step 106, where one of four boolean flags, selected in accordance with the current value of the counter K, is tested. If the flag is 'true', the procedure selects the code value containing only two binary zeroes, at step 108; if the flag is 'false' the code value containing four zeroes is selected, at step 110. In either case the procedure then inverts the value of the flag at step 112 before exiting.

A broadly similar procedure to that of FIG. 7 may be used by the circuit 46 for decoding. However, instead of obtaining a code value at step 104, the circuit 46 would check that the received code value is valid, and then obtain the corresponding data value. Likewise, at steps 108 and 110, the circuit 46 would check that the received code value is valid and has the expected number of binary zero bits, and then obtain the required data value. If any of these checks failed, the circuit 46 would determine that an error had occurred during transmission of the data frame.

It will be obvious to a person skilled in the art, given the encodings of FIG. 3 or FIG. 8, that additional encodings having the same properties may be derived therefrom by simple invariance transformations. As an example of such a transformation, the encoding of FIG. 8 may be transformed to an equivalent form by inverting the bit values of all the six-bit code values in the right-hand part (three columns) of the Figure; this process is equivalent to an exclusive-OR operation with a constant binary value of 111111. Further equivalent encodings result from an exclusive-OR operation performed with any constant five-bit binary value on all the five-bit data values in the left-hand part of the Figure; such an encoding may be further transformed by inverting the bit values of the six-bit code values, as described above, to produce another equivalent encoding.

We claim:

1. A method for communicating data over a plurality of channels, comprising the steps of:
    generating a plurality of data signals, each said signal comprising successive blocks of data; and
    simultaneously transferring said data signals over respective channels from a first point to a second point, commencement of said blocks on at least one of said channels being controlled to be temporally offset relative to commencement of said blocks on another of said channels.

2. The method of claim 1, wherein a data block on said one channel starts substantially when the mid-point of a data block occurs on said other channel.

3. The method of claim 1, wherein said data blocks have the same size and repetition rate.

4. The method of claim 1, wherein there are four channels.

5. The method of claim 4, wherein data blocks on first and second channels are substantially coincident with each other, and data blocks on third and fourth channels are substantially coincident with each other and offset relative to data blocks on said first and second channels.

6. The method of claim 1, wherein said channels comprise respective conductors in a cable having a plurality of conductors.

7. The method of claim 1, including the step of delaying signals which are to be propagated over said other channel.

8. The method of claim 7, wherein a data block has 2 n bits and said signals are delayed by n bits.

9. The method of claim 1, including the step of delaying signals which have propagated over said one channel.

10. The method of claim 1, wherein said signals are generated by directing successive portions of a data stream to said channels cyclically.

11. The method of claim 1, wherein data are encoded prior to transfer over said channels.

12. The method of claim 1, wherein each data block comprises a plurality of binary digits and commencement of said blocks on said one of said channels is controlled to be temporally offset by at least one digit period relative to commencement of said blocks on said other of said channels.

13. A system for communicating data over a plurality of channels, comprising:
 means for receiving a plurality of data signals, each said signal comprising successive blocks of data, and for transferring respective ones of said data signals over respective channels simultaneously from a first point to a second point; and
 control means for controlling commencement of said blocks on at least one of said channels to be temporally offset relative to commencement of said blocks on another of said channels.

14. The system of claim 13, wherein a data block on said one channel starts substantially when the mid-point of a data block occurs on said other channel.

15. The system of claim 13, wherein said data blocks have the same size and repetition rate for all channels.

16. The system of claim 13, wherein there are four channels.

17. The system of claim 16, wherein data blocks on first and second channels are substantially coincident with each other, and data blocks on third and fourth channels are substantially coincident with each other and offset relative to data blocks on said first and second channels.

18. The system of claim 13, wherein said channels comprise respective conductors in a cable having a plurality of conductors.

19. The system of claim 13, including first delay means arranged to delay signals to be propagated over said other channel.

20. The system of claim 19, wherein said delay means comprises shift register means.

21. The system of claim 20, wherein a data block contains 2 n bits and said shift register means contains n stages.

22. The system of claim 13, including second delay means arranged to delay signals after propagation over said one channel.

23. The system of claim 13, including means for generating said signals by directing successive portions of a data stream to said channels cyclically.

24. The system of claim 13, including means for encoding data prior to transfer over said channels.

25. The system of claim 13, wherein each data block comprises a plurality of binary digits and said control means controls commencement of said blocks on said one of said channels to be temporally offset by at least one digit period relative to commencement of said blocks on said other of said channels.

26. A method of encoding 5-bit data words as 6-bit code words for use with a cyclic redundancy check algorithm based upon the polynomial $$g(x)=x^{32}+x^{26}+x^{\leq}+x^{22}+x^{16}+x^{12}+x^{11}+x^{10}+x^8+x^7+x^5+x^4+x^2+x+1$$

wherein 6-bit code words are selected in accordance with the values of the 5-bit data words and a preselected table preselected from the group comprising a first table, a second table and any invariance transformations thereof, code word selection in the case of data words having two possible code words being of the code word from a column of the preselected table alternate to the column from which a code word was selected upon a preceding occurrence of any of such data words, wherein the first table and the second table are as set out below:

| 5-bit data word | First Table | 6-bit code | |
| --- | --- | --- | --- |
| 00000 | 111001 | | 000110 |
| 00001 | | 001110 | |
| 00010 | | 110010 | |
| 00011 | | 000111 | |
| 00100 | | 100110 | |
| 00101 | | 010011 | |
| 00110 | 011110 | | 100001 |
| 00111 | 100111 | | 011000 |
| 01000 | | 110100 | |
| 01001 | | 010110 | |
| 01010 | 111010 | | 000101 |
| 01011 | | 100011 | |
| 01100 | | 110001 | |
| 01101 | 110110 | | 001001 |
| 01110 | | .011010 | |
| 01111 | | 010101 | |
| 10000 | 101011 | | 010100 |
| 10001 | 011011 | | 100100 |
| 10010 | | 100101 | |
| 10011 | | 101010 | |
| 10100 | | 001011 | |
| 10101 | | 101001 | |
| 10110 | 010111 | | 101000 |
| 10111 | 110101 | | 001010 |
| 11000 | | 011001 | |
| 11001 | | 101100 | |
| 11010 | 101101 | | 010010 |
| 11011 | | 011100 | |
| 11100 | 101110 | | 100010 |
| 11101 | 110011 | | 001100 |
| 11110 | | 001101 | |
| 11111 | | 111000 | |

| Second Table | | |
|---|---|---|
| 5-bit data word | 6-bit code | |
| 00000 | 001100 | 110011 |
| 00001 | 101100 | |
| 00010 | 100010 | 101110 |
| 00011 | 001101 | |
| 00100 | 001010 | 110101 |
| 00101 | 010101 | |
| 00110 | 001110 | |
| 00111 | 001011 | |
| 01000 | 000111 | |
| 01001 | 100011 | |
| 01010 | 100110 | |
| 01011 | 000110 | 111001 |
| 01100 | 101000 | 010111 |
| 01101 | 011010 | |
| 01110 | 100100 | 011011 |
| 01111 | 101001 | |
| 10000 | 000101 | 111010 |
| 10001 | 100101 | |
| 10010 | 001001 | 110110 |
| 10011 | 010110 | |
| 10100 | 111000 | |
| 10101 | 011000 | 100111 |
| 10110 | 011001 | |
| 10111 | 100001 | 011110 |
| 11000 | 110001 | |
| 11001 | 101010 | |
| 11010 | 010100 | 101011 |
| 11011 | 110100 | |
| 11100 | 011100 | |
| 11101 | 010011 | |
| 11110 | 010010 | 101101 |
| 11111 | 110010 | |

27. A coder for encoding 5-bit data words as 6-bit code words for use with a cyclic redundancy check algorithm based upon the polynomial $$g(x)=x^{32}+x^{26}+x^{23}+x^{22}+x^{16}+x^{12}+x^{11}+x^{10}+x^8+x^7+x^5+x^4+x^2+x+1$$

comprising means for receiving 5-bit words and for selecting 6-bit code words in accordance with the values of the 5-bit data words and a preselected table preselected from the group comprising a first table, a second table and any invariance transformations thereof, and including means for selecting, in the case of data words having two possible code words, the code word from a column of the preselected table alternate to the column from which a code word was selected upon a preceding occurrence of any of such data words, wherein the first table and the second table are as set out below:

| First Table | | |
|---|---|---|
| 5-bit data word | 6-bit code | |
| 00000 | 111001 | 000110 |
| 00001 | 001110 | |
| 00010 | 110010 | |
| 00011 | 000111 | |
| 00100 | 100110 | |
| 00101 | 010011 | |
| 00110 | 011110 | 100001 |
| 00111 | 100111 | 011000 |
| 01000 | 110100 | |
| 01001 | 010110 | |
| 01010 | 111010 | 000101 |
| 01011 | 100011 | |
| 01100 | 110001 | |
| 01101 | 110110 | 001001 |
| 01110 | 011010 | |
| 01111 | 010101 | |
| 10000 | 101011 | 010100 |
| 10001 | 011011 | 100100 |
| 10010 | | 100101 |

-continued

| First Table | | |
|---|---|---|
| 5-bit data word | 6-bit code | |
| 10011 | 101010 | |
| 10100 | 001011 | |
| 10101 | 101001 | |
| 10110 | 010111 | 101000 |
| 10111 | 110101 | 001010 |
| 11000 | 011001 | |
| 11001 | 101100 | |
| 11010 | 101101 | 010010 |
| 11011 | 011100 | |
| 11100 | 101110 | 100010 |
| 11101 | 110011 | 001100 |
| 11110 | 001101 | |
| 11111 | 111000 | |

| Second Table | | |
|---|---|---|
| 5-bit data word | 6-bit code | |
| 00000 | 001100 | 110011 |
| 00001 | 101100 | |
| 00010 | 100010 | 101110 |
| 00011 | 001101 | |
| 00100 | 001010 | 110101 |
| 00101 | 010101 | |
| 00110 | 001110 | |
| 00111 | 001011 | |
| 01000 | 000111 | |
| 01001 | 100011 | |
| 01010 | 100110 | |
| 01011 | 000110 | 111001 |
| 01100 | 101000 | 010111 |
| 01101 | 011010 | |
| 01110 | 100100 | 011011 |
| 01111 | 101001 | |
| 10000 | 000101 | 111010 |
| 10001 | 100101 | |
| 10010 | 001001 | 110110 |
| 10011 | 010110 | |
| 10100 | 111000 | |
| 10101 | 011000 | 100111 |
| 10110 | 011001 | |
| 10111 | 100001 | 011110 |
| 11000 | 110001 | |
| 11001 | 101010 | |
| 11010 | 010100 | 101011 |
| 11011 | 110100 | |
| 11100 | 011100 | |
| 11101 | 010011 | |
| 11110 | 010010 | 101101 |
| 11111 | 110010 | |

28. A method of decoding 5-bit data words from 6-bit code words, wherein 5-bit data words are selected in accordance with the values of the 6-bit code words and a table preselected from a group comprising a first table, a second table and any invariance transformations thereof, wherein the first table and the second table are as set out below:

| First Table | | |
|---|---|---|
| 5-bit data word | 6-bit code | |
| 00000 | 111001 | 000110 |
| 00001 | 001110 | |
| 00010 | 110010 | |
| 00011 | 000111 | |
| 00100 | 100110 | |
| 00101 | 010011 | |
| 00110 | 011110 | 100001 |
| 00111 | 100111 | 011000 |
| 01000 | 110100 | |
| 01001 | 010110 | |
| 01010 | 111010 | 000101 |
| 01011 | 100011 | |

-continued

First Table

| 5-bit data word | 6-bit code | | |
|---|---|---|---|
| 01100 | | 110001 | |
| 01101 | 110110 | | 001001 |
| 01110 | | 011010 | |
| 01111 | | 010101 | |
| 10000 | 101011 | | 010100 |
| 10001 | 011011 | | 100100 |
| 10010 | | 100101 | |
| 10011 | | 101010 | |
| 10100 | | 001011 | |
| 10101 | | 101001 | |
| 10110 | 010111 | | 101000 |
| 10111 | 110101 | | 001010 |
| 11000 | | 011001 | |
| 11001 | | 101100 | |
| 11010 | 101101 | | 010010 |
| 11011 | | 011100 | |
| 11100 | 101110 | | 100010 |
| 11101 | 110011 | | 001100 |
| 11110 | | 001101 | |
| 11111 | | 111000 | |

Second Table

| 5-bit data word | 6-bit code | | |
|---|---|---|---|
| 00000 | 001100 | | 110011 |
| 00001 | | 101100 | |
| 00010 | 100010 | | 101110 |
| 00011 | | 001101 | |
| 00100 | 001010 | | 110101 |
| 00101 | | 010101 | |
| 00110 | | 001110 | |
| 00111 | | 001011 | |
| 01000 | | 000111 | |
| 01001 | | 100011 | |
| 01010 | | 100110 | |
| 01011 | 000110 | | 111001 |
| 01100 | 101000 | | 010111 |
| 01101 | | 011010 | |
| 01110 | 100100 | | 011011 |
| 01111 | | 101001 | |
| 10000 | 000101 | | 111010 |
| 10001 | | 100101 | |
| 10010 | 001001 | | 110110 |
| 10011 | | 010110 | |
| 10100 | | 111000 | |
| 10101 | 011000 | | 100111 |
| 10110 | | 011001 | |
| 10111 | 100001 | | 011110 |
| 11000 | | 110001 | |
| 11001 | | 101010 | |
| 11010 | 010100 | | 101011 |
| 11011 | | 110100 | |
| 11100 | | 011100 | |
| 11101 | | 010011 | |
| 11110 | 010010 | | 101101 |
| 11111 | | 110010 | |

29. A decoder for decoding 5-bit data words from 6-bit code words, comprising means for receiving 6-bit code words and for selecting 5-bit data words in accordance with the values of the 6-bit code words and a table preselected from a group comprising a first table, a second table and any invariance transformations thereof, wherein the first table and the second table are as set out below:

First Table

| 5-bit data word | 6-bit code | | |
|---|---|---|---|
| 00000 | 111001 | | 000110 |
| 00001 | | 001110 | |
| 00010 | | 110010 | |
| 00011 | | 000111 | |

-continued

First Table

| 5-bit data word | 6-bit code | | |
|---|---|---|---|
| 00100 | | 100110 | |
| 00101 | | 010011 | |
| 00110 | 011110 | | 100001 |
| 00111 | 100111 | | 011000 |
| 01000 | | 110100 | |
| 01001 | | 010110 | |
| 01010 | 111010 | | 000101 |
| 01011 | | 100011 | |
| 01100 | | 110001 | |
| 01101 | 110110 | | 001001 |
| 01110 | | 011010 | |
| 01111 | | 010101 | |
| 10000 | 101011 | | 010100 |
| 10001 | 011011 | | 100100 |
| 10010 | | 100101 | |
| 10011 | | 101010 | |
| 10100 | | 001011 | |
| 10101 | | 101001 | |
| 10110 | 010111 | | 101000 |
| 10111 | 110101 | | 001010 |
| 11000 | | 011001 | |
| 11001 | | 101100 | |
| 11010 | 101101 | | 010010 |
| 11011 | | 011100 | |
| 11100 | 101110 | | 100010 |
| 11101 | 110011 | | 001100 |
| 11110 | | 001101 | |
| 11111 | | 111000 | |

Second Table

| 5-bit data word | 6-bit code | | |
|---|---|---|---|
| 00000 | 001100 | | 110011 |
| 00001 | | 101100 | |
| 00010 | 100010 | | 101110 |
| 00011 | | 001101 | |
| 00100 | 001010 | | 110101 |
| 00101 | | 010101 | |
| 00110 | | 001110 | |
| 00111 | | 001011 | |
| 01000 | | 000111 | |
| 01001 | | 100011 | |
| 01010 | | 100110 | |
| 01011 | 000110 | | 111001 |
| 01100 | 101000 | | 010111 |
| 01101 | | 011010 | |
| 01110 | 100100 | | 011011 |
| 01111 | | 101001 | |
| 10000 | 000101 | | 111010 |
| 10001 | | 100101 | |
| 10010 | 001001 | | 110110 |
| 10011 | | 010110 | |
| 10100 | | 111000 | |
| 10101 | 011000 | | 100111 |
| 10110 | | 011001 | |
| 10111 | 100001 | | 011110 |
| 11000 | | 110001 | |
| 11001 | | 101010 | |
| 11010 | 010100 | | 101011 |
| 11011 | | 110100 | |
| 11100 | | 011100 | |
| 11101 | | 010011 | |
| 11110 | 010010 | | 101101 |
| 11111 | | 110010 | |

30. A method for communicating data over a plurality of channels, comprising the steps of:
generating a stream of data comprising successive blocks of data;
dividing said data stream into a plurality m of data sub-streams in a cyclic manner such that every mth block of said stream is assigned to the mth said sub-stream; and simultaneously transferring said data sub-streams over respective channels from a first point to a second point, commencement of said blocks on at least one of said channels being controlled to be temporally offset relative to commencement of said blocks on another of said channels.

31. A system for communicating data over a plurality of channels, comprising:

means for receiving a stream of data comprising successive blocks of data;

means for dividing said data stream into a plurality m of data substreams in a cyclic manner such that every mth block of said stream is assigned to the mth said sub-stream;

means for transferring said data sub-streams over respective channels simultaneously from a first point to a second point; and control means for controlling commencement of said blocks on at least one of said channels being controlled to be temporally offset relative to commencement of said blocks on another of said channels.

* * * * *